(12) United States Patent
Nakano

(10) Patent No.: US 11,322,436 B2
(45) Date of Patent: May 3, 2022

(54) SEMICONDUCTOR MODULE AND METHOD OF MANUFACTURING THE SAME

(71) Applicant: FUJI ELECTRIC CO., LTD., Kawasaki (JP)

(72) Inventor: Hayato Nakano, Kofu (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/034,611

(22) Filed: Sep. 28, 2020

(65) Prior Publication Data

US 2021/0143147 A1 May 13, 2021

(30) Foreign Application Priority Data

Nov. 8, 2019 (JP) .............................. JP2019-203152

(51) Int. Cl.
*H01L 23/498* (2006.01)
*H01L 27/02* (2006.01)
(Continued)

(52) U.S. Cl.
CPC ........ *H01L 23/49838* (2013.01); *H01L 22/20* (2013.01); *H01L 23/12* (2013.01);
(Continued)

(58) Field of Classification Search
CPC ..... H01L 27/0288; H01L 22/20; H01L 23/12; H01L 23/48; H01L 23/4824;
(Continued)

(56) References Cited

U.S. PATENT DOCUMENTS

2005/0242748 A1* 11/2005 Nagahara ................. H05K 5/02
315/169.4
2018/0090473 A1* 3/2018 Nakahara ................ H01L 24/40
(Continued)

FOREIGN PATENT DOCUMENTS

| JP | 2005260141 A | 9/2005 |
|----|--------------|--------|
| JP | 2010205845 A | 9/2010 |

(Continued)

*Primary Examiner* — Eduardo A Rodela
(74) *Attorney, Agent, or Firm* — Staas & Halsey LLP

(57) ABSTRACT

A semiconductor module includes: a first metal plate including a first mount part joined with a bottom-surface electrode of a first switching element, a second mount part joined with a positive-electrode terminal, and a first narrow part between the first and second mount parts and being narrower than a part jointing the first switching element to the first mount part and the positive-electrode terminal; a second metal plate being joined with a bottom-surface electrode of a second switching element, and connected to a top-surface electrode of the first switching element; a third metal plate including a sixth mount part joined with a negative-electrode terminal, a seventh mount part connected to a top-surface electrode of the second switching element, and being narrower than the negative-electrode terminal, and a second narrow part between the sixth and seventh mount parts; and a snubber circuit connecting the first and second narrow parts.

9 Claims, 9 Drawing Sheets

(51) Int. Cl.
*H02M 1/34* (2007.01)
*H01L 21/66* (2006.01)
*H01L 23/12* (2006.01)
*H01L 29/16* (2006.01)
*H01L 23/64* (2006.01)
*H01L 23/492* (2006.01)
*H01L 49/02* (2006.01)
*H01L 23/482* (2006.01)

(52) U.S. Cl.
CPC ........ *H01L 23/4824* (2013.01); *H01L 23/492* (2013.01); *H01L 23/642* (2013.01); *H01L 23/647* (2013.01); *H01L 27/0255* (2013.01); *H01L 27/0288* (2013.01); *H01L 28/20* (2013.01); *H01L 28/40* (2013.01); *H01L 29/1608* (2013.01); *H02M 1/34* (2013.01)

(58) Field of Classification Search
CPC ..... H01L 23/485; H01L 23/49; H01L 23/492; H01L 23/498; H01L 23/49838; H01L 23/528; H01L 23/538; H01L 23/5386; H01L 23/585; H01L 23/64; H01L 23/642; H01L 23/647; H01L 27/0629; H01L 28/20; H01L 28/40; H01L 2924/1205; H01L 2924/1207; H01L 25/0652; H01L 21/4846; H01L 21/4871; H01L 21/4878; H02M 1/34

See application file for complete search history.

(56) References Cited

U.S. PATENT DOCUMENTS

2019/0006272 A1* 1/2019 Kai ...................... H05K 3/3426
2020/0286864 A1 9/2020 Horiguchi et al.
2021/0143093 A1* 5/2021 Ichikawa ................ H01L 24/42

FOREIGN PATENT DOCUMENTS

| | | |
|---|---|---|
| JP | 2017208987 A | 11/2017 |
| JP | 201980417 A | 5/2019 |
| WO | 2018143429 A1 | 8/2018 |

* cited by examiner

SEMICONDUCTOR MODULE AND METHOD OF MANUFACTURING THE SAME

CROSS-REFERENCE TO RELATED APPLICATION

This application claims benefit of priority under 35 USC 119 based on Japanese Patent Application No. 2019-203152 filed on Nov. 8, 2019, the entire contents of which are incorporated by reference herein.

BACKGROUND

1. Field of the Invention

The present invention relates to a semiconductor module and a method of manufacturing the semiconductor module.

2. Description of the Related Art

Semiconductor modules used for power conversion devices such as inverters typically include, as a switching element, a vertical integrated gate bipolar transistor (IGBT) or a metal-oxide-semiconductor field effect transistor (MOS-FET) provided on a silicon (Si) semiconductor substrate. To ensure high efficiency and high breakdown voltage, the use of wide bandgap semiconductors of silicon carbide (SiC) or gallium nitride (GaN) has been increased, and a MOS-FET mounted on a SiC semiconductor substrate is often used in recent years.

A semiconductor module used for a power inverter includes a negative-electrode side metal plate, a load side metal plate, and a negative-electrode side metal plate. The negative-electrode side metal plate is provided with a positive-electrode terminal and is joined with one surface of a positive-electrode side switching element. The load side metal plate is provided with a load terminal, is connected with the other surface of the positive-electrode side switching element, and is joined with one surface of a negative-electrode side switching element. The negative-electrode side metal plate is provided with a negative-electrode terminal and is joined with the other surface of the negative-electrode side switching element.

It is known that a semiconductor module causes a current/voltage peak or oscillation, which is called ringing, during the switching operation. If a peak value of a voltage upon ringing exceeds a rated voltage of the semiconductor module, the semiconductor module may be damaged.

The ringing, which may cause noise, needs to be reduced as much as possible. The reduction in the ringing is the important problem to be solved particularly in a switching element using a wide bandgap semiconductor in order to take advantage of the high-speed switching operation.

The use of a snubber circuit is one of the ways of reducing the ringing. For example, WO 2018/143429 A1 discloses a semiconductor module including a snubber substrate which is an insulating substrate provided with a capacitor and a resistor and connected between a negative-electrode metal plate and a negative-electrode metal plate. JP 2017-208987 A discloses a semiconductor module in which a snubber circuit including a capacitor and a blown material are connected between a negative-electrode metal plate and a negative-electrode metal plate. JP 2010-205845 A discloses a semiconductor module including a semiconductor snubber circuit connected in parallel to a switching element and a freewheeling diode, in which values of a capacitor and a resistor vary depending on the area of an electrode. JP 2005-260141 A discloses a semiconductor module including, on an insulating substrate, a dielectric layer serving as a snubber circuit between a conductor pattern connected with an external terminal and a conductor pattern connected with a ground terminal. JP 2019-80417 A discloses a snubber circuit in which a capacitor is connected between a positive-electrode terminal and a negative-electrode terminal through a wire or a metal plate (FIG. 2, FIG. 5 and FIG. 6).

The use of such a snubber circuit still has a problem of an insufficient reduction in the ringing particularly when a frequency is high.

SUMMARY

In view of the foregoing problem, the present invention provides a semiconductor module and a method of manufacturing the semiconductor module capable of reducing ringing caused during a switching operation of a switching element, regardless of the use of a wide bandgap semiconductor particularly having a high switching speed.

To solve the above-mentioned problem, an aspect of the present invention inheres in a semiconductor module encompassing: an insulating substrate having a top surface; a first switching element including a top-surface electrode and a bottom-surface electrode opposed to the top-surface electrode; a second switching element including a top-surface electrode and a bottom-surface electrode opposed to the top-surface electrode; a first metal plate mounted on the top surface of the insulating substrate, and including a first mount part joined with the bottom-surface electrode of the first switching element, a second mount part joined with a positive-electrode terminal and connected to the first mount part, and a first narrow part located at a connected part between the first mount part and the second mount part and having a narrower width than a part at which the first switching element is joined to the first mount part and than the positive-electrode terminal; a second metal plate mounted on the top surface of the insulating substrate, and including a third mount part joined with the bottom-surface electrode of the second switching element, a fourth mount part joined with a load terminal and connected to the third mount part, and a fifth mount part connected to the top-surface electrode of the first switching element via a first conductive member and connected to the fourth mount part; a third metal plate mounted on the top surface of the insulating substrate, and including a sixth mount part joined with a negative-electrode terminal, a seventh mount part connected to the top-surface electrode of the second switching element via a second conductive member, connected to the sixth mount part, and having a narrower width than the negative-electrode terminal, and a second narrow part located at a connected part between the sixth mount part and the seventh mount part; and a snubber circuit including a capacitor and a resistor and connecting the first narrow part and the second narrow part.

Another aspect of the present invention inheres in a method of a semiconductor module, encompassing: preparing an insulating substrate provided on a top surface with a first metal plate including a first mount part, a second mount part, and a first narrow part located at a connected part between the first mount part and the second mount part and having a narrower width than a part at which a switching element is joined to the first mount part, a second metal plate including a third mount part, a fourth mount part, and a fifth mount part, and a third metal plate including a sixth mount part, a seventh mount part, and a second narrow part located at a connected part between the sixth mount part and the seventh mount part; joining a bottom-surface electrode of a first switching element to the first mount part, joining a bottom-surface electrode of a second switching element to the third mount part, and joining one end of a capacitor, which also has another end, to one of the first narrow part and the second narrow part; joining a positive-electrode terminal to the second mount part, joining a load terminal to the fourth mount part, joining a negative-electrode terminal to the sixth mount part, joining a first conductive member to a top-surface electrode of the first switching element and the fifth mount part, and joining a second conductive member to a top-surface electrode of the second switching element and the seventh mount part; operating the first switching element and the second switching element and acquiring a voltage waveform of one of or both of the first switching element and the second switching element; analyzing the acquired voltage waveform to detect ringing to calculate a resistance value necessary for reducing a ringing voltage; preparing a resistive wire having one end and another end in accordance with the calculated resistance value; and joining the one end of the prepared resistive wire to the other one of the first narrow part and the second narrow part and connecting the other end of the resistive wire to the other end of the capacitor.

DETAILED DESCRIPTION

Figure 1:
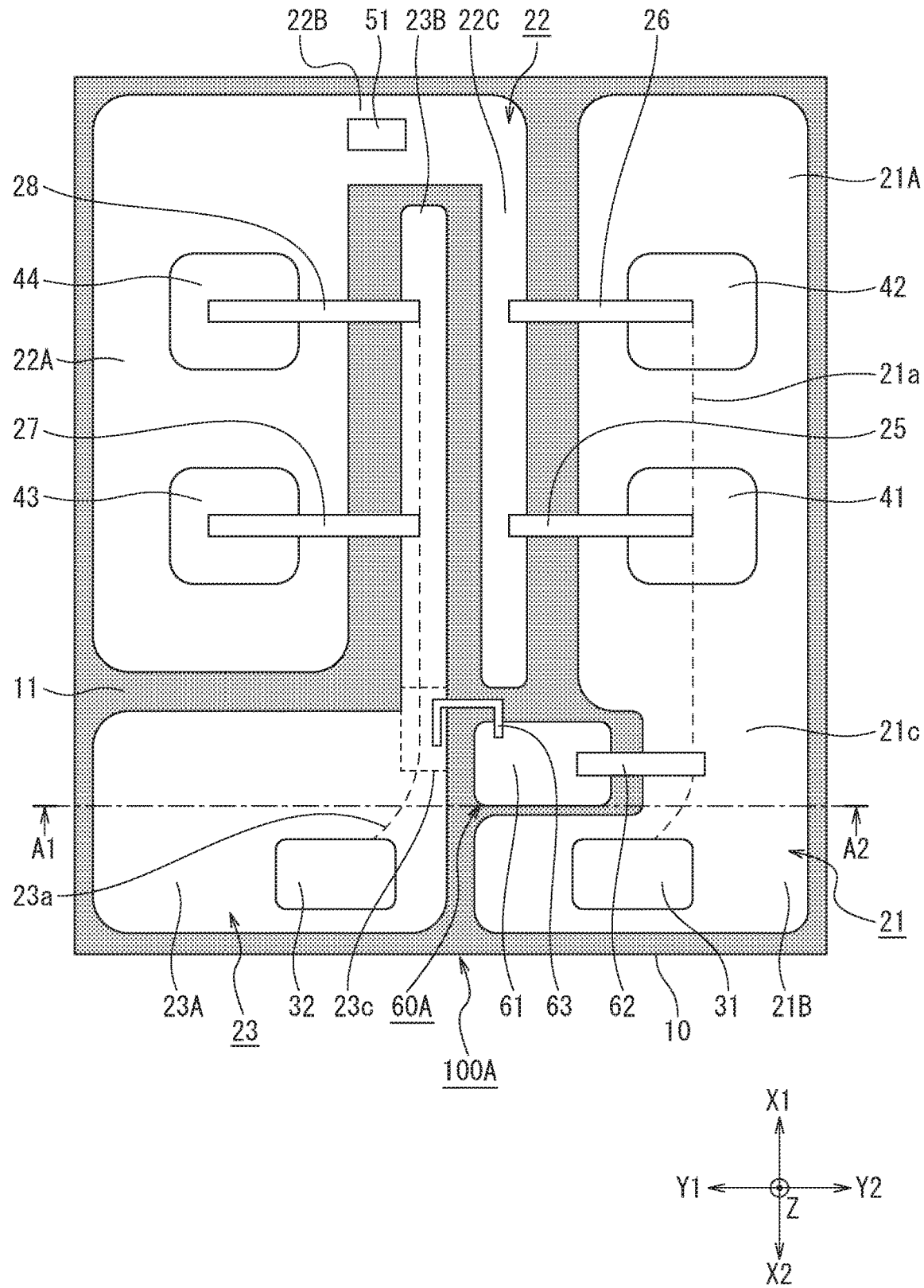
FIG. 1 is a plan view illustrating a configuration of main parts of a semiconductor module according to a first embodiment of the present invention.

One or more embodiments will be described below. In the explanations of the Drawings below, the same or similar components are denoted by the same or similar reference numerals, and overlapping explanations are not made below. It should be understood that the Drawings are illustrated schematically, and relationships between thicknesses and planar dimensions, and proportions of the respective devices and the thicknesses of the respective members are not drawn to scale. The specific thicknesses and dimensions thus should be determined in accordance with the following explanations. It also should be understood that the relationships or proportions of the dimensions between the respective Drawings may differ from each other.

The following explanations of the Drawings may indicate the directions by use of an X-axis direction, a Y-axis direction, and a Z-axis direction. For example, the X-axis direction and the Y-axis direction are parallel to a top surface 11 of an insulating substrate 10 described below. The Z-axis direction is a thickness direction of the insulating substrate 10 described below. The X-axis direction, the Y-axis direction, and the Z-axis direction are perpendicular to each other. In the following explanations, the positive direction in the Z-axis may be referred to as a "top", and the negative direction in the Z-axis may be referred to as a "bottom". The definitions of the "top" and the "bottom" do not necessarily mean the vertical direction with respect to the ground. In other words, the directions toward the "top" and the "bottom" are not limited to the gravity direction. The definitions of the "top" and the "bottom" are merely used for illustration purposes to define the relative positional relationship between the layers and the substrate, which do not limit the technical idea of the present invention. For example, when the observing direction of the sheet is changed by 180 degrees, the definitions of the "top" and the "bottom" shall be reversed.

First Embodiment (Configuration of Semiconductor Module 100A)

FIG. 1 is a schematic diagram of a top surface of a semiconductor module 100A according to a first embodiment of the present invention. As illustrated in FIG. 1, the semiconductor module 100A includes an insulating substrate 10, a switching element 42 as a first switching element, a switching element 44 as a second switching element, a copper plate 21 as a first metal plate, a copper plate 22 as a second metal plate, a copper plate 23 as a third metal plate, a copper plate 61 as a fourth metal plate, and a CR snubber circuit 60A including a capacitor 62 and a resistive wire 63.

The insulating substrate 10 may be any of a direct copper bonding (DCB) substrate, a direct bonded aluminum (DBA) substrate, an active metal brazing (AMB) substrate, and a metal-based plate, and the respective metal plates used can be a copper plate or an aluminum plate. The insulating substrate 10 according to the present embodiment is presumed to be a DCB substrate, and the respective metal plates are presumed to be a copper plate. The respective switching elements can be an IGBT or a MOS-FET provided on a Si semiconductor substrate, or can be a reverse-conducting IGBT or MOS-FET having a function of reverse conduction. Alternatively, the respective switching elements may be a MOS-FET provided on a wide bandgap semiconductor substrate of SiC or GaN, instead of the Si semiconductor substrate.

To ensure the protective function during switching, a diode (freewheeling diode) connected antiparallel to the switching element may be used. Examples of diodes include a p-n diode, a p-i-n diode, and a Schottky barrier diode (SBD). Alternatively, a diode provided on a wide bandgap semiconductor substrate may be used, as in the case of the respective switching elements. According to the present embodiment, the SiC MOS-FET is used for the switching elements 42 and 44, and the SBD provided on the SiC semiconductor substrate is used for freewheeling diodes 41 and 43. The resistive wire is preferably an alloy wire having a resistivity of 50 µΩ·cm or greater.

The copper plate 21 includes a mount part 21A joined with the respective bottom surfaces of the switching element 42 and the freewheeling diode 41, a mount part 21B joined with a positive-electrode terminal 31 and connected to the mount part 21A, and a narrow part 21c located at the connection part between the mount part 21A and the mount part 21B. The mount part 21A extends in the X-axis direction, and the mount part 21B extends in the Y-axis direction. The copper plate 21 may be formed into an L-shape in the plan view. The width of the narrow part 21c in the Y-axis direction is narrower than the width of the part in the Y-axis direction at which the switching element 42 and the freewheeling diode 41 are joined to the mount part 21A, and narrower than the width of the positive-electrode terminal 31. This configuration causes a current to concentrate at the narrow part 21c on a current path 21a connecting the switching element 42 and the freewheeling diode 41 with the positive-electrode terminal 31.

The copper plate 22 includes a mount part 22A joined with the respective bottom surfaces of the switching element 44 and the freewheeling diode 43, a mount part 22B joined with a load terminal 51 and connected to the mount part 22A, and a mount part 22C arranged adjacent and parallel to the mount part 22A and connected to the mount part 22B. The mount part 22C is connected to the respective top surfaces of the switching element 42 and the freewheeling diode 41 via conductive members 26 and 25. The mount parts 22A and 22C extend in the X-axis direction, and the mount part 22B extends in the Y-axis direction. The copper plate 22 has a U-shape in the plan view, and the mount parts 22A and 22C are connected to the mount part 22B at the end in the X1 direction.

The copper plate 23 includes a mount part 23A joined with a negative-electrode terminal 32, a mount part 23B arranged adjacent to the mount part 22A and connected to the mount part 23A, and a narrow part 23c located at the connection part between the mount part 23A and the mount part 23B. The width of the mount part 23B is narrower than the negative-electrode terminal 32, and is connected to the respective top surfaces of the switching element 44 and the freewheeling diode 43 via conductive members 28 and 27. The mount part 23A extends in the Y-axis direction, and the mount part 23B extends in the X-axis direction. The copper plate 23 has an L-shape in the plan view. This configuration causes a current to concentrate at the narrow part 23c on a current path 23a connecting the switching element 44 and the freewheeling diode 43 with the negative-electrode terminal 32.

The mount parts 21B and 23A are arranged at the edge of the insulating substrate 10, and the copper plate 61 is provided between the narrow parts 21c and 23c respectively connected to the mount parts 21B and 23A. One end of the copper plate 61 and the narrow part 21c are joined with the capacitor 62, and the other end of the copper plate 61 and the narrow part 23c are joined with the resistive wire 63. This configuration implements the CR snubber circuit 60A between the respective narrow parts 21c and 23c, so as to reduce ringing caused between the positive-electrode terminal 31 and the negative-electrode terminal 32. The mount parts 22A, 23B, 22C, and 21A are arranged substantially in parallel in this order. The narrow part 23c includes the boundary areas adjacent to the respective mount parts 23A and 23B, and is a region having a higher current density than the outer circumference of the negative-electrode terminal 32.

The respective mount parts 21A, 21B, 22A, 22B, 22C, 23A, and 23B may be a thin strip metal plate. As used herein, the term "thin strip metal plate" refers to a metal plate having a substantially rectangular shape overall, and encompasses a shape rounded at the corners, a shape partly having an increased/decreased width, and a shape tapered so as to be provided with an additional metal plate. The thin strip metal plate may partly have a recess, a projection, or a slit. The respective conductive members 25, 26, 27, and 28 used may be a wire, a ribbon, or a copper plate, for example.

The material used for the resistive wire 63 included in the snubber circuit 60A is a copper (Cu)-nickel (Ni) alloy, for example. Other examples include a Cu-manganese (Mn)—Ni alloy, a Ni-chromium (Cr)-aluminum (Al) alloy, a Ni—Cr alloy, an iron (Fe)—Cr alloy, and an Fe—Cr—Al alloy. The insulating substrate 10 is provided on a base plate (not illustrated), and is coated with a cover at the circumference and the top so as to fabricate a semiconductor module. The insulating substrate 10 may be provided with a copper plate for gate wiring (not illustrated), a sense terminal for monitoring a potential of the corresponding electrode, and a copper plate for a terminal for measuring a temperature, and may be connected to an external terminal housed in a case. The load terminal 51 is connected with a load (not illustrated). The load is a motor driven by alternating current power, for example.

Figure 2:
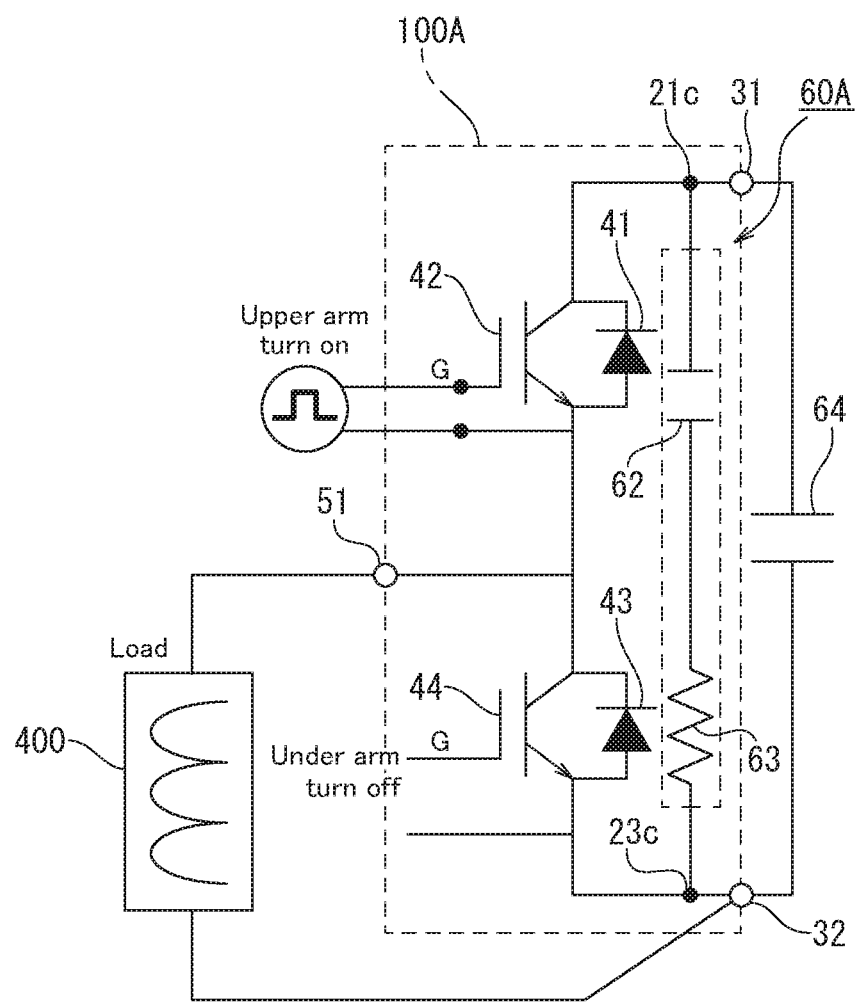
FIG. 2 is a circuit configuration diagram illustrating an equivalent circuit of the semiconductor module according to the first embodiment of the present invention.

FIG. 2 illustrates an equivalent circuit of the semiconductor module 100A. The equivalent circuit is configured such that the switching element 42 which is the MOS-FET of SiC is connected antiparallel to the freewheeling diode 41 which is the SBD of SiC between the positive-electrode terminal 31 and the load terminal 51, and such that the switching element 44 which is the MOS-FET of SiC is connected antiparallel to the freewheeling diode 43 which is the SBD of SiC between the load terminal 51 and the negative-electrode terminal 32. The CR snubber circuit 60A is connected parallel to the respective switching elements 42 and 44 and the respective freewheeling diodes 41 and 43.

The CR snubber circuit 60A has a configuration in which the capacitor 62 and the resistive wire 63 are connected in series. While the CR snubber circuit 60A can be connected parallel to a C snubber including a capacitor, the CR snubber circuit 60A according to the present embodiment is externally connected with a C snubber including a capacitor 64. A load is typically provided between load terminals of a plurality of circuits configured as described above or between a load terminal and the ground. The load 400 according to the present embodiment is provided between the load terminal 51 and the negative-electrode terminal 32 in order to exhibit the favorable effects.

The semiconductor module 100A configured as described above is provided inside with a resonance circuit. A ringing frequency of the resonance circuit is about 15 MHz, for example. When the load 400 and the capacitor 64 are connected to start the switching operation, waveform oscillation of a resonance frequency, which is ringing, is caused. This ringing frequency is, for example, 12.5 MHz which is substantially equivalent to the ringing frequency of the resonance circuit inside the module. The ringing frequency inside the module is measured, so as to select a member for the CR snubber circuit to suppress the ringing during the operation of the module. To damp these resonance frequencies, a resistance value of the resistive wire 63 may be set in a range of 1 to 10Ω, and a capacitance value of the capacitor 62 may be set to smaller than 10 nF, for example.

Figure 3A:
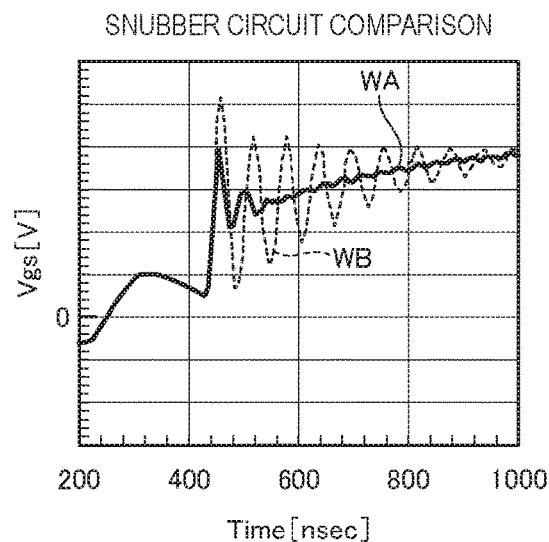
FIGS. 3A to 3D are characteristic diagrams indicating examples of a comparison between a CR snubber circuit according to the first embodiment of the present invention and a snubber circuit only including a capacitor.
Figure 3B:
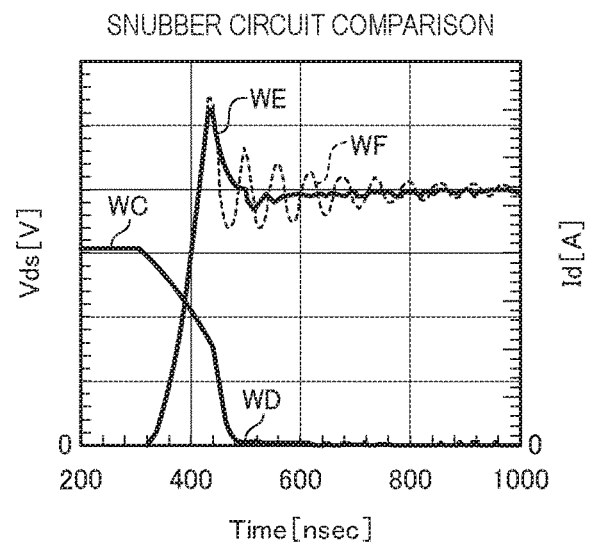
Figure 3C:
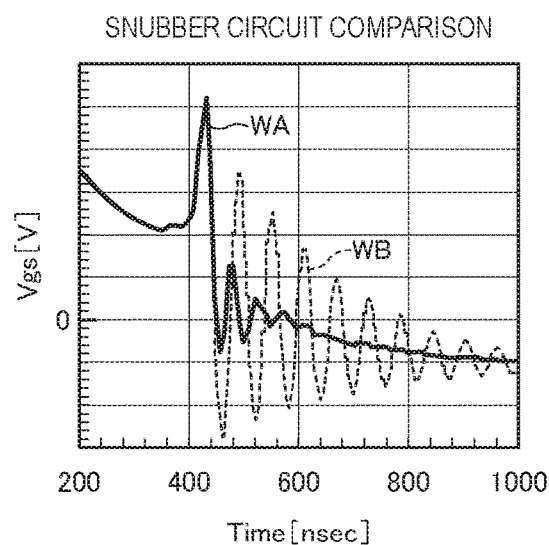
Figure 3D:
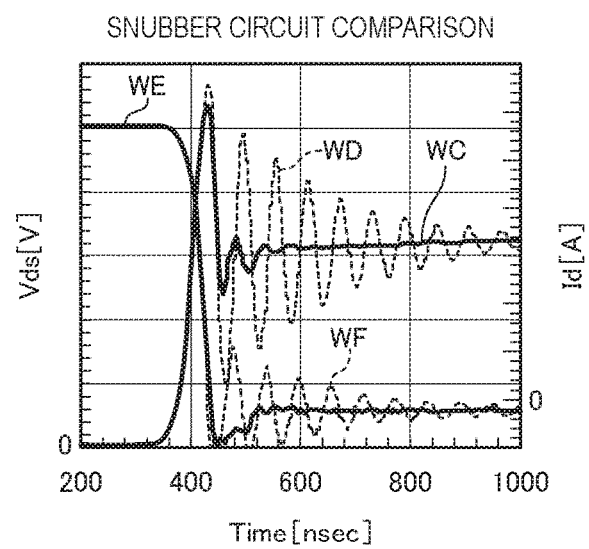

FIGS. 3A to 3D are characteristic diagrams illustrating a comparison between a case of using the C snubber including the capacitor 64 provided outside the module and including the CR snubber circuit 60A of the series circuit including the capacitor 62 and the resistive wire 63 within the module and a case without including the CR snubber circuit 60A. FIG. 3A illustrates a waveform indicating a change with time in a gate-source voltage Vgs at the switching element 42 of the MOS-FET when turned on, and FIG. 3B illustrates a waveform indicating a change with time in a drain-source voltage Vds and a drain current Id. FIG. 3C illustrates a waveform indicating a change with time in the gate-source voltage Vgs at the switching element 42 of the MOS-FET when turned off, and FIG. 3D illustrates a waveform indicating a change with time in the drain-source voltage Vds and the drain current Id. The axis of abscissas in FIGS. 3A to 3D indicates the time, and the axis of ordinates indicates the voltage and the current.

The respective solid lines WA in the FIGS. 3A to 3D indicate the waveform of the gate-source voltage Vgs when the CR snubber circuit 60A is provided in the semiconductor module 100A, and the respective dotted lines WB indicate the waveform of the gate-source voltage Vgs when the CR snubber circuit 60A is not provided in the semiconductor module 100A. The respective solid lines WC indicate the waveform of the drain-source voltage Vds when the CR snubber circuit 60A is provided in the semiconductor module 100A, and the respective dotted lines WD indicate the waveform of the drain-source voltage Vds when the CR snubber circuit 60A is not provided in the semiconductor module 100A. The respective solid lines WE indicate the waveform of the drain current Id when the CR snubber circuit 60A is provided in the semiconductor module 100A, and the respective dotted lines WF indicate the waveform of the drain current Id when the CR snubber circuit 60A is not provided in the semiconductor module 100A.

As illustrated in FIGS. 3A to 3D, the provision of the CR snubber circuit 60A can damp the resonance frequency. The CR snubber circuit 60A including the series circuit of the capacitor 62 and the resistive wire 63 and the capacitor 64 and connected between the narrow part 21c and the narrow part 23c, can reduce the ringing during the switching operation of the switching element 42.

Figure 4:
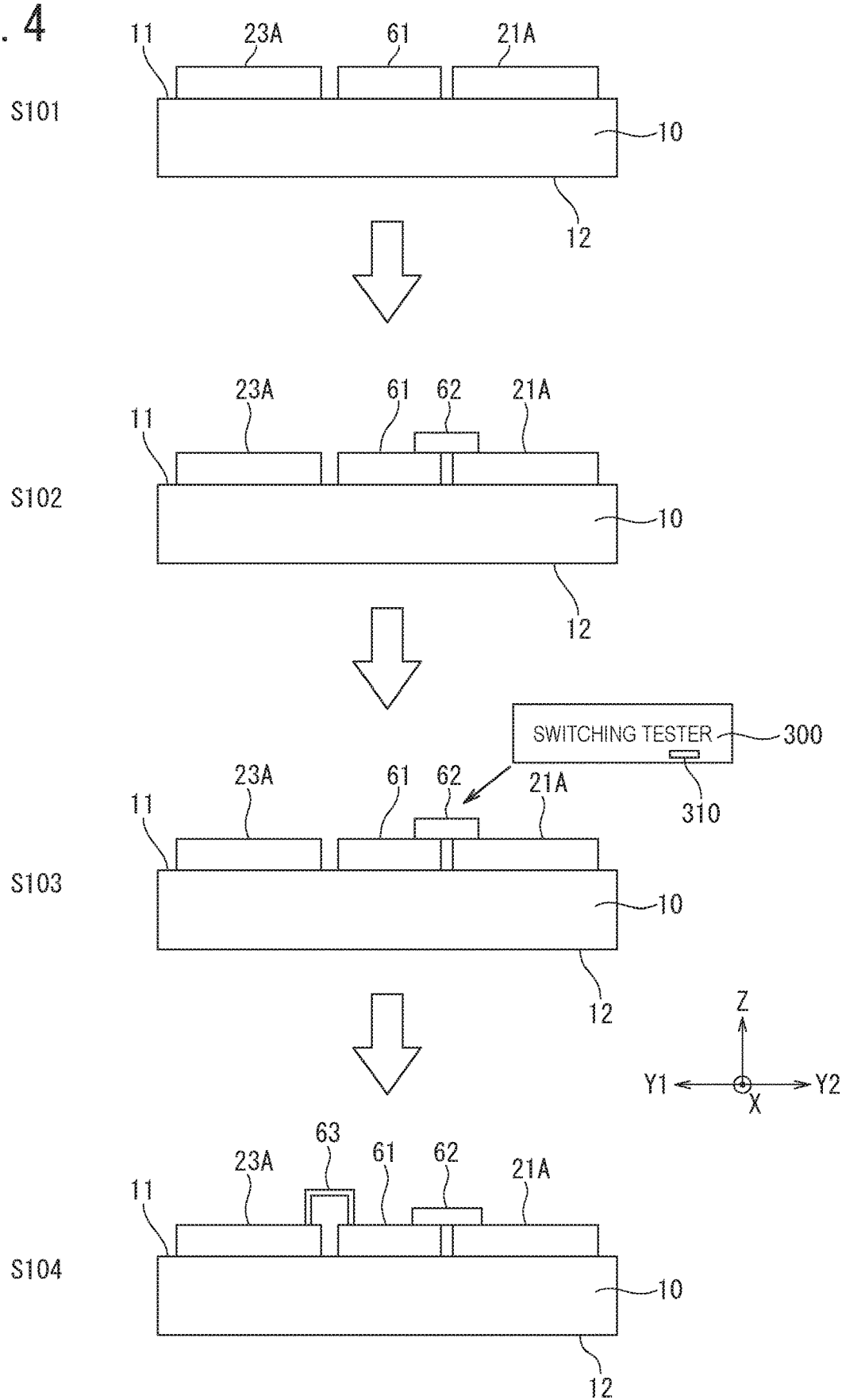
FIG. 4 is an explanatory diagram illustrating a process of a method of manufacturing the semiconductor module according to the first embodiment of the present invention.

(Process of Manufacturing Semiconductor Module 100A)
FIG. 4 is an explanatory diagram illustrating a method of manufacturing the semiconductor module 100A according to the first embodiment of the present invention. The manufacturing method according to the present embodiment includes step S101 to step S104. FIG. 4 illustrates the semiconductor module 100A as viewed from the chain line A1-A2 in the direction indicated by the arrow X1 in FIG. 1.

In step S101, the insulating substrate 10 is prepared, having the top surface 11 and the bottom surface 12, and including the copper plate 21 including the mount part 21A, the mount part 21B, and the narrow part 21c, the copper plate 22 including the mount part 22A, the mount part 22B, and the mount part 22C, the copper plate 23 including the mount part 23A, the mount part 23B, and the narrow part 23c, and the copper plate 61 for the CR snubber circuit 60A. In step S102, the freewheeling diode 41 and the switching element 42 are joined to the mount part 21A of the copper plate 21. The freewheeling diode 43 and the switching element 44 are joined to the mount part 22A of the copper plate 22.

One end of the capacitor 62 is joined to the narrow part 21c, and the other end of the capacitor 62 is joined to one end of the copper plate 61. The positive-electrode terminal 31 is joined to the mount part 21B, the load terminal 51 is joined to the mount part 22B, and the negative-electrode terminal 32 is joined to the mount part 23A. The conductive member 25 is joined to the top surface of the freewheeling diode 41 and the mount part 22C. The conductive member 26 is joined to the top surface of the switching element 42 and the mount part 22C. The conductive member 27 is joined to the top surface of the freewheeling diode 43 and the mount part 22B. The conductive member 28 is joined to the top surface of the switching element 44 and the mount part 23B.

Figure 5:
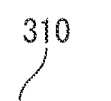
FIG. 5 is a diagram illustrating an example of a table stored in a switching tester used for the method of manufacturing the semiconductor module according to the first embodiment of the present invention.

In step S103, the semiconductor module 100A is connected to a switching tester 300, and the switching element 42 and the switching element 44 are operated so as to measure the drain-source voltage waveform. The switching tester 300 is, for example, an electrolytic capacitor, a load, a gate driver, an oscilloscope, or a probe, and stores a table 310 illustrated in FIG. 5.

The table 310 stores several resistance values of the resistive wire 63 for each wire length and each wire diameter. For example, when the wire length is 20 millimeters and the wire diameter is 80 micrometers, the resistive wire 63 corresponding to a Cu—Ni alloy having a resistance of 2.0Ω is used. When the wire length is 20 millimeters and the wire diameter is 70 micrometers, the resistive wire 63 corresponding to a Ni—Cr alloy having a resistance of 5.2Ω is used. When the wire length is 20 millimeters and the wire diameter is 60 micrometers, the resistive wire 63 corresponding to an Fe—Cr alloy having a resistance of 8.7Ω is used.

Figure 6:
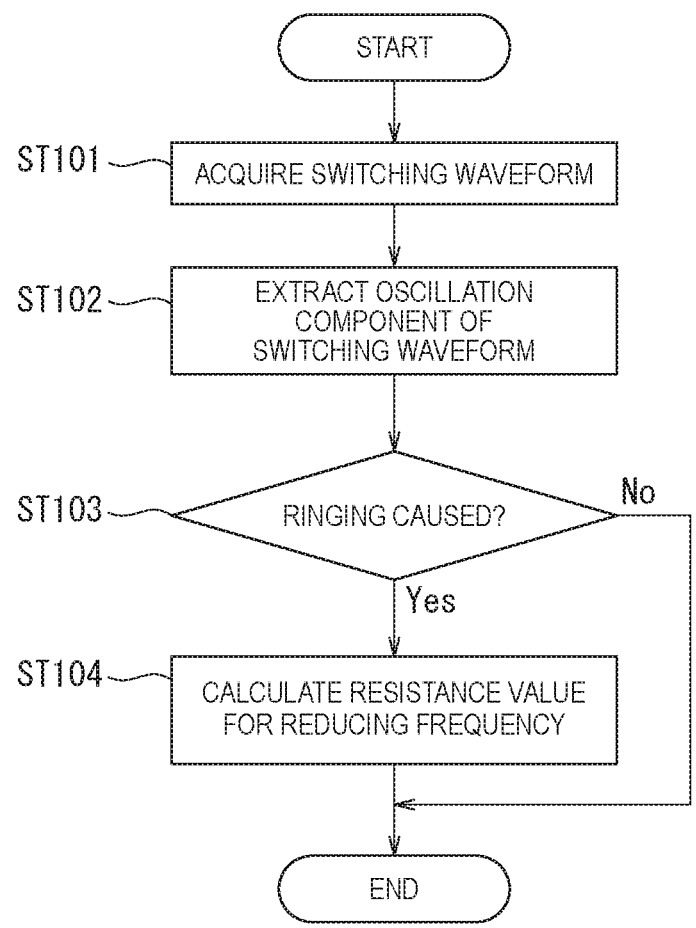
FIG. 6 is a flowchart illustrating control processing steps of the switching tester used for the method of manufacturing the semiconductor module according to the first embodiment of the present invention.

FIG. 6 is a flowchart illustrating control processing steps executed by the switching tester 300. The semiconductor module 100A is connected to the switching tester 300, and the drain-source voltage waveform during the switching operation of the switching elements 42 and 44 is acquired (in step ST101), so as to extract an oscillation component (in step ST102). The switching tester 300 is presumed to determine that the ringing is caused in the switching elements 42 and 44 when a peak value of the switching waveform during a predetermined period exceeds a predetermined threshold (in step ST103). The frequency of the ringing caused in the switching elements 42 and 44 in association with the switching operation is calculated in accordance with the extracted oscillation component, and the resistance value necessary for reducing the ringing is calculated (in step ST104).

For example, when the resonance frequency of the semiconductor module 100A is defined as f0, the resistance value of the resistive wire 63 is set such that the product of the resistance value and the capacitance value of the CR snubber circuit 60A is smaller than 1/f0 so as to suppress the resonance characteristics of the resonance frequency f0. According to the present embodiment, the resistance value of the resistive wire 63 is only determined while the capacitance value of the capacitor 62 is set to a constant value. The switching tester 300 refers to the table 310 in accordance with the calculated resistance value as described above, and causes a display device (not illustrated) to display the resistance value, the material, the wire length, and the wire diameter of the wire when the corresponding resistive wire is detected. For example, when the calculated resistance value is 8.7Ω, the switching tester 300 causes the display device to display the information including "the resistance value of 8.7Ω", "the Fe—Cr alloy", "the wire length of 20 millimeters", and "the wire diameter of 60 micrometers". A manufacturer thus can immediately recognize the resistive wire which should be used. The manufacturer then prepares the resistive wire which is "the Fe—Cr alloy" having "the wire length of 20 millimeters" and "the wire diameter of 60 micrometers" displayed on the display device of the switching tester 300, for example.

In step S104 illustrated in FIG. 4, one end of the prepared resistive wire 63 is joined to the narrow part 23c, and the other end of the resistive wire 63 is joined to the other end of the copper plate 61. When the resistance value calculated by the switching tester 300 is not stored in the table 310, the manufacturer may adjust the resistance value while varying the length of the Ni—Cr alloy wire, for example, or adjust the resistance value while varying the diameter of the Fe—Cr alloy wire, for example, depending on the corresponding resistance value. While the arrangement of the capacitor 62 is preferably made in association with the arrangement of the respective switching element 42 and 44 and the respective freewheeling diodes 41 and 43, the arrangement may be made after the connection between the top surfaces of the semiconductor elements and the copper plates or after the ringing evaluation, since the arrangement has no influence on the switching waveform before both the capacitor 62 and the resistive wire 63 are connected.

(Operational Effects of Semiconductor Module 100A)

If the switching frequency particularly increases, the effect of the reduction in ringing by the snubber circuit tends to be insufficient because of a current distribution on the copper plates. To deal with this, the semiconductor module 100A according to the first embodiment of the present invention includes the narrow part 21c, at which a current tends to be concentrated, located adjacent to the mount part 21B joined with the positive-electrode terminal 31, and the narrow part 23c, at which a current tends to be concentrated, located adjacent to the mount part 23A joined with the negative-electrode terminal 32. The CR snubber circuit 60A is joined and linked between the respective narrow parts 21c and 23c, so as to absorb the high frequency caused due to the switching operation of the switching element 42 and the switching element 44.

The ringing caused during the switching operation of the switching element 42 and the switching element 44 thus can be reduced. The semiconductor module 100A according to the first embodiment of the present invention including the narrow part 21c in the copper plate 21 at which the CR snubber circuit 60A is joined, can specify the joined position of the CR snubber circuit 60A when connected, and can arrange the copper plate 61 of the CR snubber circuit 60A in a free space of the insulating substrate 10 which can be obtained by decreasing the width of the mount part 21A in the Y1-axis direction to provide the narrow part 21c. This can also avoid an increase in size of the insulating substrate 10.

The semiconductor module 100A according to the first embodiment of the present invention can implement the CR snubber circuit 60A using the resistive wire 63 so as to achieve a reduction in size with a simple configuration. The method of manufacturing the semiconductor module 100A according to the first embodiment of the present invention can execute the test operation for the switching elements using the switching tester 300, acquire the voltage waveform during the switching operation, and analyze the acquired waveform to calculate the resistance value necessary for reducing the oscillation before the CR snubber circuit 60A is connected.

Choosing the wire having the resistance value necessary for the reduction in the oscillation phenomenon and connecting the wire between the narrow part 21c and the narrow part 23c together with the capacitor 62 before the connection of the CR snubber circuit 60A, can enable the manufacture of the semiconductor module 100A having high reliability and capable of accurately reducing the ringing caused during the switching operation of the switching elements, regardless of the change in the resonance frequency due to the variation of the switching elements or the metal plates inside the module.

Second Embodiment (Configuration of Semiconductor Module 100B)

Figure 7:
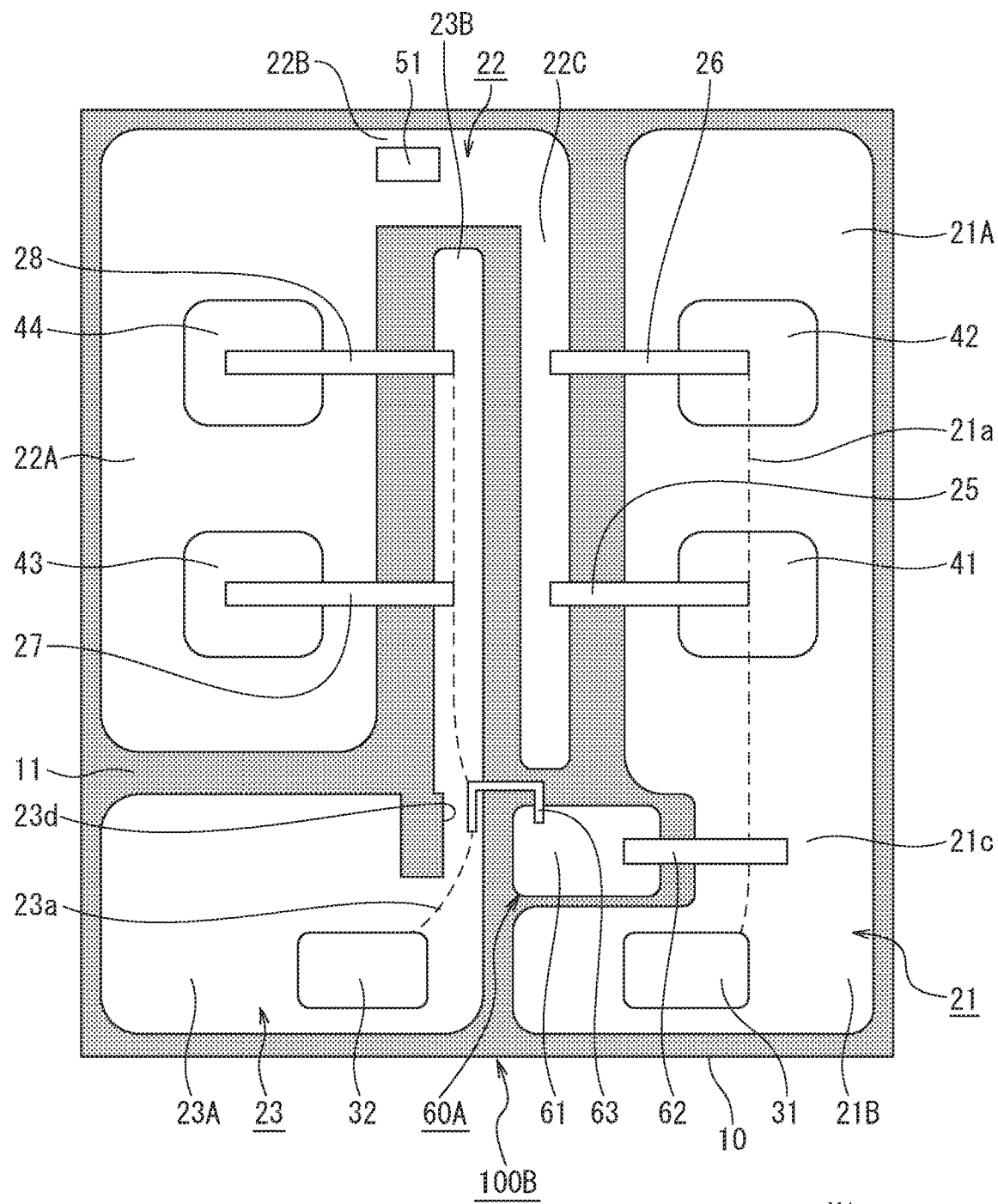
FIG. 7 is a plan view illustrating a configuration of main parts of a semiconductor module according to a second embodiment of the present invention.
Figure 7:
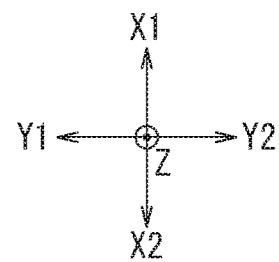

FIG. 7 is a plan view illustrating a configuration of main parts of a semiconductor module 100B according to a second embodiment of the present invention. This embodiment uses copper plates as metal plates as in the case of the first embodiment. The semiconductor module 100B is provided with a slit elongated in the direction in which the mount part 23B extends (in the direction indicated by the arrow X2 in FIG. 7) at the boundary between the mount part 23A and the mount part 23B, and includes a narrow part 23d narrower than the negative-electrode terminal 32. The capacitor 62 is joined between the narrow part 21c and one end of the copper plate 61 (in the direction indicated by the arrow Y2 in FIG. 7). The resistive wire 63 is joined to the other end of the copper plate 61 (in the direction indicated by the arrow Y1 in FIG. 7) and the narrow part 23d.

(Operational Effects of Semiconductor Module 100B)

The semiconductor module 100B according to the second embodiment of the present invention has a configuration in which the slit is provided in the mount part 23A to provide the narrow part 23d narrower than the negative-electrode terminal 32, so as to increase the current density at the connection part of the CR snubber circuit 60A to improve the effect of the reduction in ringing. This can increase the current density at the narrow part 23d, so as to achieve the improved effects more than the first embodiment of the present invention.

Other Embodiments

While the present invention has been described above by reference to the respective embodiments, it should be understood that the present invention is not intended to be limited to the descriptions and the drawings composing part of this disclosure, and includes the scope of the claims and the meanings and all of the changes equivalent to and within the corresponding claims. Various alternative embodiments and modified examples will be included in the present invention which are apparent to those skilled in the art according to this disclosure.

While the first embodiment described above has been illustrated with the case in which the resistive wire of the Cu—Ni alloy, the resistive wire of the Ni—Cr alloy, and the resistive wire of the Fe—Cr alloy are stored in the table 310, the present invention is not limited to the case of the resistive wire of the Cu—Ni alloy, the resistive wire of the Ni—Cr alloy, and the resistive wire of the Fe—Cr alloy. For example, the resistive wire of the Cu—Mn—Ni alloy, the resistive wire of the Ni—Cr—Al alloy, or the resistive wire of the Fe—Cr—Al alloy may be stored in the table 310.

While the present invention has been illustrated with the case in which the wire length and the wire diameter are displayed with reference to the table 310, the material, the wire length, and the wire diameter appropriately used may be calculated and displayed according to the necessary resistor and information on the resistivity of the wire. The table 310 may be configured to indicate the wire length and the wire diameter of the resistor for each wire material. While the present invention has been illustrated with the case in which the capacitance value of the capacitor 62 is set to 10 nF or smaller, the capacitance value may be set to be 10 nF or greater depending on the capacitance of the elements.

Figure 8:
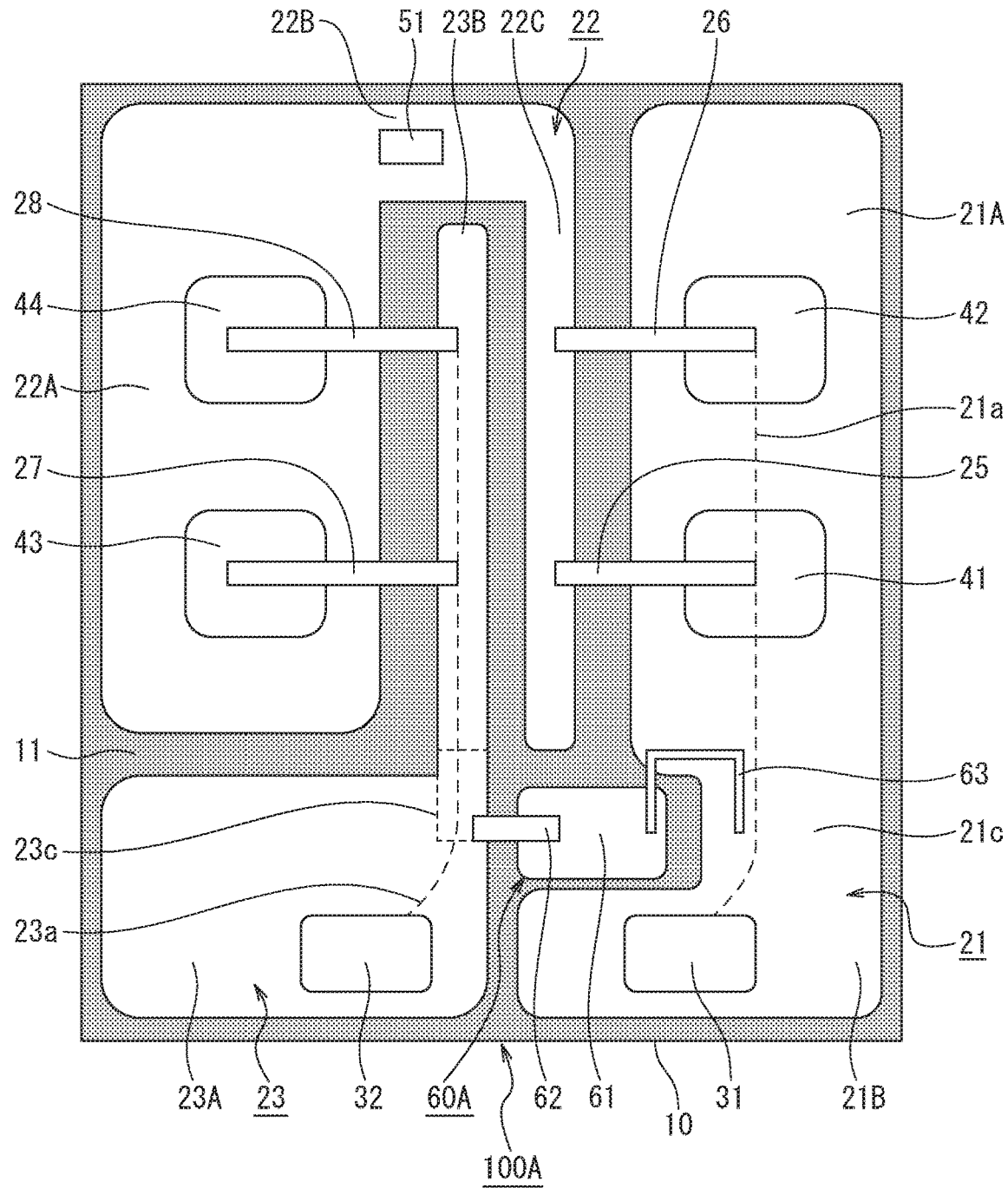
FIG. 8 is a plan view illustrating an example of a configuration of main parts of a semiconductor module according to another embodiment of the present invention.
Figure 8:
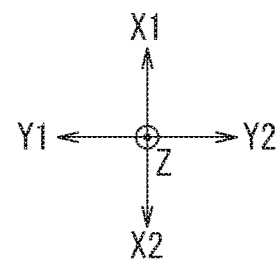
Figure 9:
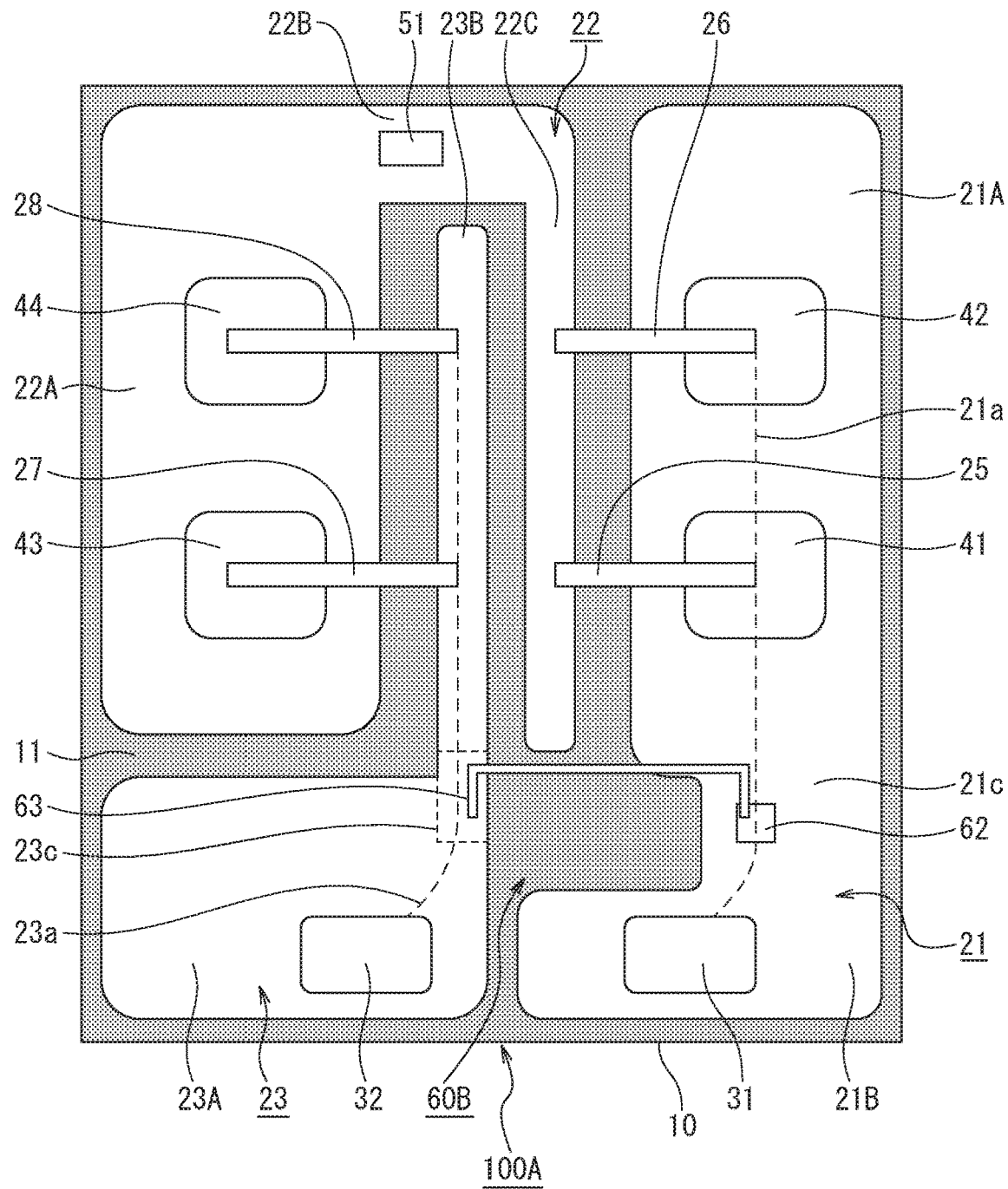
FIG. 9 is a plan view illustrating another example of the configuration of the main parts of the semiconductor module according to the other embodiment of the present invention.

For example, while the first and second embodiments have been illustrated with the case in which the capacitor 62 is joined to the narrow part 21c and one end of the copper plate 61, and the resistive wire 63 is joined to the other end of the copper plate 61 and the narrow part 23c, the resistive wire 63 may be joined to the narrow part 21c and the one end of the copper plate 61, and the capacitor 62 may be joined to the other end of the copper plate 61 and the narrow part 23c, as illustrated in FIG. 8. For example, while the above embodiments have been illustrated with the case in which both ends of the capacitor are joined and connected to the copper plates, one end of the capacitor 62 may be joined to the one narrow part 21c, and the resistive wire 63 may be joined to the other end of the capacitor 62 and the other narrow part 23c, as illustrated in FIG. 9.

For example, while the first and second embodiments have been illustrated with the case in which the resistive wire made of the alloy is used as a resistor for the snubber circuit, a combination of a chip resistor and an aluminum wire may be used instead. For example, while the first and second embodiments have been illustrated with the case of using the copper plates 21, 22, 23, and 61 as metal plates, aluminum plates or tin-plated copper plates may be used instead of the copper plates.

For example, while the first and second embodiments have been illustrated with the case in which the SiC switching elements 42 and 44 and the freewheeling diodes 41 and 43 are mounted to the copper plates 21 and 22, the switching elements may only be used. While the first and second embodiments have been illustrated with the case in which the switching elements 42 and 44, the freewheeling diodes 41 and 43, and the CR snubber circuit 60A are sequentially arranged in the direction from the load terminal 51 side (from the X1 side) toward the positive-electrode terminal 31 and the negative-electrode terminal 32 (to the X2 side), the arrangement order of the switching elements 42 and 44 and the freewheeling diodes 41 and 43 may be reversed. The respective switching elements may have the function of reverse conduction. The number of the respective elements is not limited to one, and two or more elements may be used. The above embodiments have been illustrated with the case in which the switching element 44 and the freewheeling diode 43 are mounted to the copper plate 22, but are not limited to this case, as in the case of the copper plate 21 as described above.

For example, while the first and second embodiments have been illustrated with the case of using the SiC semiconductor elements, a wide bandgap semiconductor element may partly be used, or a Si semiconductor element may be used for all elements. In either case, the elements are preferably configured so that the current is set in common during the conduction between the positive-electrode terminal and the load terminal and during the conduction between the negative-electrode terminal and the load terminal. The type, the configuration, and the control processing steps of the switching tester 300 are not limited to those described in the first embodiment, and may be modified as appropriate.

What is claimed is:

1. A semiconductor module comprising:
an insulating substrate having a top surface;
a first switching element including a top-surface electrode and a bottom-surface electrode opposed to the top-surface electrode;
a second switching element including a top-surface electrode and a bottom-surface electrode opposed to the top-surface electrode;
a first metal plate mounted on the top surface of the insulating substrate, and including a first mount part joined with the bottom-surface electrode of the first switching element, a second mount part joined with a positive-electrode terminal and connected to the first mount part, and a first narrow part connected between the first mount part and the second mount part and having a narrower width than a portion of the first mount part at which the first switching element is joined to the first mount part and than a portion of the second mount part at which the positive-electrode terminal is joined to the second mount part;
a second metal plate mounted on the top surface of the insulating substrate, and including a third mount part joined with the bottom-surface electrode of the second switching element, a fourth mount part joined with a load terminal and connected to the third mount part, and a fifth mount part connected to the top-surface electrode of the first switching element via a first conductive member and connected to the fourth mount part;
a third metal plate mounted on the top surface of the insulating substrate, and including a sixth mount part joined with a negative-electrode terminal, a seventh mount part connected to the top-surface electrode of the second switching element via a second conductive member, connected to the sixth mount part, and having a narrower width than the negative-electrode terminal, and a second narrow part located at a connected part between the sixth mount part and the seventh mount part; and
a snubber circuit including a capacitor and a resistor and connecting the first narrow part and the second narrow part.

2. The semiconductor module of claim 1, wherein the resistor is a resistive wire.

3. The semiconductor module of claim 2, further comprising a fourth metal plate mounted on the top surface of the insulating substrate, having one end and another end, and arranged between the first narrow part and the second narrow part,
wherein the capacitor has one end and another end, the one end being joined to one of the first narrow part and the second narrow part, the other end being joined to the one end of the fourth metal plate, and
the resistive wire has one end and another end, the one end being joined to the other one of the first narrow part and the second narrow part, the other end being joined to the other end of the fourth metal plate.

4. The semiconductor module of claim 2, wherein the resistive wire includes an alloy selected from the group consisting of a copper (Cu)-nickel (Ni) alloy, a Cu-manganese (Mn)—Ni alloy, a Ni-chromium (Cr)-aluminum (Al) alloy, a Ni—Cr alloy, an iron (Fe)—Cr alloy, and an Fe—Cr—Al alloy.

5. The semiconductor module of claim 1, wherein the first switching element and the second switching element are each a wide bandgap semiconductor element.

6. A method of manufacturing a semiconductor module, comprising:
- preparing an insulating substrate provided on a top surface with
  - a first metal plate including a first mount part, a second mount part, and a first narrow part connected between the first mount part and the second mount part and having a narrower width than a portion of the first mount part at which a first switching element is joined to the first mount part,
  - a second metal plate including a third mount part, a fourth mount part, and a fifth mount part, and
  - a third metal plate including a sixth mount part, a seventh mount part, and a second narrow part connected between the sixth mount part and the seventh mount part;
- joining a bottom-surface electrode of the first switching element to the first mount part, joining a bottom-surface electrode of a second switching element to the third mount part, and joining one end of a capacitor, which also has another end, to one of the first narrow part and the second narrow part;
- joining a positive-electrode terminal to the second mount part, joining a load terminal to the fourth mount part, joining a negative-electrode terminal to the sixth mount part, joining a first conductive member to a top-surface electrode of the first switching element and the fifth mount part, and joining a second conductive member to a top-surface electrode of the second switching element and the seventh mount part;
- operating the first switching element and the second switching element and acquiring a voltage waveform of one of or both of the first switching element and the second switching element;
- analyzing the acquired voltage waveform to detect ringing to calculate a resistance value necessary for reducing a ringing voltage;
- preparing a resistive wire having one end and another end in accordance with the calculated resistance value; and
- joining the one end of the prepared resistive wire to the other one of the first narrow part and the second narrow part and connecting the other end of the resistive wire to the other end of the capacitor.

7. The method of claim 6, wherein:
the insulating substrate includes, on a top surface, a fourth metal plate having one end and another end;
in the joining the one end of the capacitor to one of the first narrow part and the second narrow part, the other end of the capacitor is joined to the one end of the fourth metal plate; and
in the connecting the other end of the resistive wire to the other end of the capacitor, the other end of the resistive wire is joined to the other end of the fourth metal plate.

8. The method of claim 6, wherein the preparing the resistive wire includes choosing at least one of a wire length and a wire diameter in accordance with the calculated resistance value.

9. The method of claim 6, wherein the preparing the resistive wire includes preparing a wire including at least an alloy selected from the group consisting of a copper (Cu)-nickel (Ni) alloy, a Cu-manganese (Mn)—Ni alloy, a Ni-chromium (Cr)-aluminum (Al) alloy, a Ni—Cr alloy, an iron (Fe)—Cr alloy, and an Fe—Cr—Al alloy, in accordance with the calculated resistance value.

* * * * *